US006936526B2

(12) United States Patent
Fu et al.

(10) Patent No.: US 6,936,526 B2
(45) Date of Patent: Aug. 30, 2005

(54) METHOD OF DISORDERING QUANTUM WELL HETEROSTRUCTURES

(75) Inventors: Lan Fu, Palmerston (AU); Hark Hoe Tan, Garran (AU); Chennupati Jagadish, Evatt (AU)

(73) Assignee: The Australian National University, Acton (AU)

( * ) Notice: Subject to any disclaimer, the term of this patent is extended or adjusted under 35 U.S.C. 154(b) by 0 days.

(21) Appl. No.: 10/381,814
(22) PCT Filed: Sep. 28, 2001
(86) PCT No.: PCT/AU01/01216

§ 371 (c)(1),
(2), (4) Date: Sep. 8, 2003

(87) PCT Pub. No.: WO02/27774

PCT Pub. Date: Apr. 4, 2002

(65) Prior Publication Data

US 2004/0038503 A1 Feb. 26, 2004

(30) Foreign Application Priority Data

Sep. 28, 2000 (AU) ............................................. PR0439

(51) Int. Cl.⁷ ............................................. H01L 21/04
(52) U.S. Cl. ...................... 438/511; 438/514; 438/518; 438/522; 438/528
(58) Field of Search ................................ 438/511, 514, 438/518, 522, 528; 257/12, 14, 19, 21

(56) References Cited

U.S. PATENT DOCUMENTS

| 4,902,897 | A | * | 2/1990 | Iwamatsu ............... 250/423 R |
| 5,192,709 | A | * | 3/1993 | Petroff ........................ 438/508 |
| 5,238,868 | A | | 8/1993 | Elman et al. |
| 5,395,793 | A | * | 3/1995 | Charbonneau et al. ...... 438/797 |
| 6,420,728 | B1 | * | 7/2002 | Razeghi ........................ 257/14 |
| 6,540,953 | B1 | * | 4/2003 | Lee et al. .................... 264/413 |

OTHER PUBLICATIONS

Allard, et al., "Threshold Dose for Ion–Induced Intermixing in inGaAs/GaAs Quantum Wells", (1994) Applied Physics Letters, 64, pp. 2412–2414.
Charbonneau, et al., "Photonic Integrated Circuits Fabricated Using Ion Implantation", (1998) IEEE Journal of Selected Topics in Quantum Electronics 4, pp. 772–793.
Charbonneau, et al., "Band–Gap Tuning of InGaAs/InGaAsP/InP.Laser Using High Energy Ion Implantation", (1995) Applied Physics Letters 67, pp. 2954–2956.
Charbonneau, et al., "Quantum–Well Intermixing of Optoelectronic Integration Using High Energy Ion Implantation", (1995) Journal of Applied Physics 78, pp. 3697–3705.
Fu, et al., "Proton Irradiation–Induced Intermixing in GaAs/(Al)GaAs Quantum Wells and Quantum–Well Lasers", (1999) Journal of Applied Physics Letters 85, pp. 6786–6789.

(Continued)

*Primary Examiner*—Hsien-Ming Lee
(74) *Attorney, Agent, or Firm*—Knobbe, Martens, Olson & Bear, LLP (57) ABSTRACT

A method of disordering a quantum well heterostructure, including the step of irradiating the heterostructure with a particle beam, wherein the energy of the beam is such that the beam creates a substantially constant distribution of defects within the heterostructure. The irradiating particles can be ions or electrons, and the energy is preferably such that the irradiating particles pass through the heterostructure. Light ions such as hydrogen ions are preferred because they are readily available and produce substantially uniform distributions of point defects at relatively low energies. The method can be used to tune the wavelength range of an optoelectronic device including such a heterostructure, such as a photodetector.

25 Claims, 6 Drawing Sheets

OTHER PUBLICATIONS

Liu, et al., "Wavelength Tuning of GaAs/AlGaAs Quantum–Well Infrared Photo–Detectors by Proton Implantation Induced Intermixing", (2000) Japanese Journal of applied Physics 39, pp. 1687–1689.

Fu, et al., "Postgrowth Wavelength Tuning of Optoelectronic Devices by Ion Implantation Induced Quantum Well Intermixing", (2000) Proceedings of Conf. on Optoelectronic and Microelectronic Materials and Devices, Melbourne, Australia, pp. 344–347.

Fu, et al., "Tuning of Detection Wavelength of Quantum–Well Infrared Photodetectors by Quantum Well Intermixing", (2001) Infrared Physics and Technology, 42/3–5, pp. 171–175.

Fu, et al., "Tuning the Detection Wavelength of Quantum–Well Infrared Photodetectors by Single High–Energy Implantation", (2001) Applied Physics Letters 78, pp. 10–12.

Goldberg, et al., "Ion Beam Intermixing of Semiconductor Heterostructures for Optoelectronic Applications", (1997), Nuclear Instruments, & Methods in Physics Research Section B, 127, pp. 418–422.

Haysom, et al., "Lateral Selectivity of Ion–Induced Quantum Well Intermixing", (1998), Journal of Vacuum Science and Technology A 16, pp. 817–820.

He, et al., "Bandgap Shifted InGaAsP/InP Quantum Well Waveguides Using Mev Ion Implantation", (1995), Electronic Letters 31, pp. 2094–2095.

Johnston, et al., "Interdiffused Quantum–Well Infrared Photodetectors for Color Sensitive Arrays", (1999) Applied Physics Letters 75, pp. 923–925.

Li, et al., "Proton Implantation and Rapid Thermal Annealing Effects on GaAs/AlGaAs Quantum Well Infrared Photodectors", (1999) Superlattices and Microstructures 26, pp. 317–324.

Piva, et al., "Ion Implantation Enhanced Intermixing of Al–Free 980 nm Laser Structures" (1998) Applied Physics Letters 73, pp. 67–69.

Piva, et al., "Bandgap Tuning of Semiconductor Quantum Well Structures Using Ion Implantation", (1994) Superlattices & Microstructures 15, pp. 385–389.

Poole, et al., "Demonstration of an Ion–Implanted, Wavelength–shifted Quantum–Well Laser", (1996) IEEE Photonics Technology Letters 8, pp. 16–18.

Poole, et al., " The Fabrication of a Broad–Spectrum Light–Emitting Diode Using High Energy Ion Implantation" (1996) IEEE Photonics Technology Letters 8, pp. 1145–1147.

Poole, et al., "Defect Diffusion in Ion Implanted AlGaAs and InP—Consequences for Quantum Well Intermixing" (1995) Journal of Applied Physics 78, pp. 2367–2371.

Poole, et al., "The Enhancement of Quantum Well Intermixing Through Repeated Ion Implantation" (1994) Semiconductor Science & Technology 9, pp. 2134–3137.

Steele, et al., "Postgrowth Tuning of Quantum–Well Infrared Detectors by Rapid Thermal Annealing" (1994) Journal of Applied Physics Letters 75, pp. 8234–8236.

Tan, et al., "Wavelength Shifting in GaAs Quantum Wells Lasers by Proton Irradiation", (1997) Applied Physics Letters 71, pp. 2680–2682.

Charbonneau, et al., "Bandgap tuning of semiconductor Quantum Well laser structures using high energy ion implantation", (1995) Nuclear Instruments and Methods in Physics Research B, pp. 457–460.

Li, et al., "Multiple energy proton implantation induced quantum well intermixing in GaAs/AiGaAs quantum–well infrared photodetectors", (1999) CLEO/Pacific Rim '99, pp. 312–313.

R.D. Goldberg, et al., "Selective Intermixing of Ion Irradiated Semiconductor Heterostructures", (1999) Mat. Res. Soc. Sump. Proc. vol. 540, pp. 15–26.

* cited by examiner

PRIOR ART

Figure 1

PRIOR ART

Figure 2

PRIOR ART

METHOD OF DISORDERING QUANTUM WELL HETEROSTRUCTURES

BACKGROUND OF THE INVENTION

1. Field of the Invention

The present invention relates to a method of disordering quantum well heterostructures, a method of tuning the wavelength range of quantum well optoelectronic devices, and structures or devices produced by these methods.

2. Description of the Related Art

Figure 1:
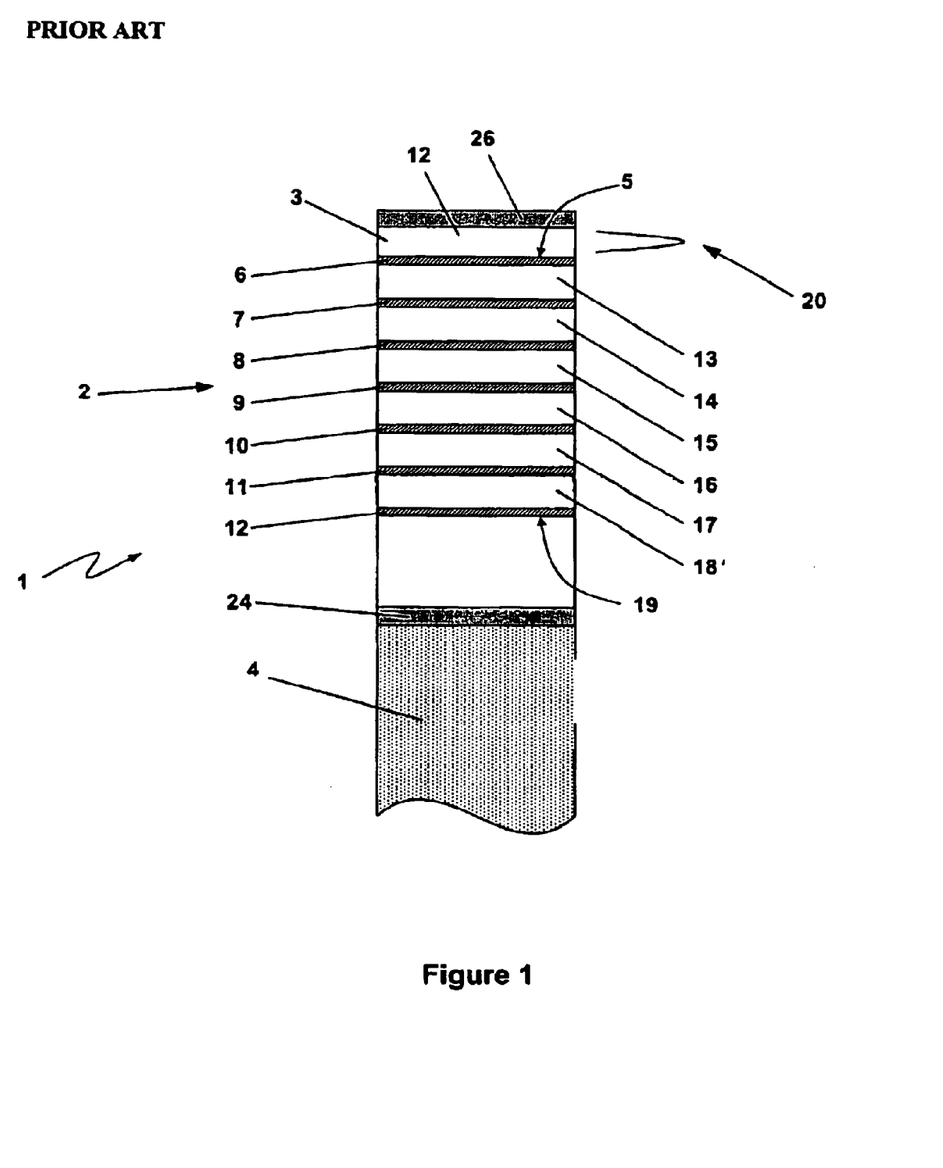
FIG. 1 is a schematic representation of an optoelectronic device including a quantum well heterostructure and a defect depth profile produced by a prior art method.

The wavelength range of quantum well optoelectronic devices can be tuned by disordering (or 'interdiffusing' or 'intermixing') the quantum well boundaries. Although this can be achieved by various types of processing, ion irradiation or implantation is a particularly attractive method because it is accurate, reproducible, and easily confined to arbitrary lateral geometries. Moreover, the range of depths disordered by irradiation may be tailored by selecting appropriate ion beam energies. FIG. 1 shows a prior art optoelectronic device 1 including a quantum well heterostructure 2. This device 1 can be fabricated by depositing alternating thin layers of two semiconductors with different energy band structures on top of a bottom contact layer 24 grown on a substrate 4, and then depositing a top contact layer 26. The heterostructure 2 contains layers 6 to 12 of a first semiconductor and layers 13 to 18 of a second semiconductor. The heterostructure 2 is defined as the region containing layers 6 to 18 located between the top interface 5 and the lowest interface 19. The heterostructure layers 6 to 18 may be grown by techniques such as molecular beam epitaxy (MBE) or chemical vapour deposition (CVD). If the layers 6 to 12 with the smaller band gap are sufficiently thin, they can form quantum wells which trap charge carriers and constrain their energies to a series of bound states according to the laws of quantum mechanics. Such a heterostructure can be used to fabricate optoelectronic devices with operating wavelengths determined by the energy states of the quantum well, which depend upon the band structures of the semiconductors and the thicknesses and compositions of the well layers 6 to 12 and the barrier layers 13 to 18. However, the wavelength range of an existing heterostructure may be changed or 'tuned' by disordering or 'intermixing' the semiconductor layers to some extent. This changes the well properties and therefore the energy levels of the well and hence the operating wavelength range. Intermixing is effected by supplying point defects to the quantum well interfaces. Ion implantation is a useful method for generating point defects in a controlled manner, and can be used for quantum well intermixing. It is especially useful because lithographic techniques may be used to mask selected areas to restrict intermixing to the exposed areas. This allows different optoelectronic devices on the same wafer to operate in different wavelength regions.

A number of prior art approaches have been taken to quantum well intermixing. U.S. Pat. No. 5,395,793 discloses a method whereby a low energy implant is used to produce a distribution of defects 20 in a layer 3 above the quantum well heterostructure layers 6 to 18, as shown in FIG. 1. Following implantation, the heterostructure 2 is heated, and some of the defects diffuse down through the heterostructure 2, intermixing the wells.

However, because the well regions are not directly irradiated, the defects must diffuse there from the implanted regions, which can result in (i) a non-uniform distribution of defects within the heterostructure 2, and (ii) poor efficiency, since the defects diffuse in all directions away from the implanted regions, and many will be trapped or annihilated at nearby interfaces. Moreover, only low ion fluences are used in order to avoid the formation of stable defect complexes and extended defects, which would trap many of the point defects formed during the implant. This is especially true if an amorphous layer is formed, which greatly reduces the relative number of point defects diffusing into the heterostructure 2, and leads to the formation of stable 'end of range' dislocation loops. The presence of these stable defects is likely to degrade the performance of optoelectronic devices fabricated from the heterostructure 2. Consequently, the amount of intermixing available from a single implant is limited, and multiple interleaved implant and annealing sequences are required to obtain substantial layer intermixing and wavelength shifts.

Figure 2:
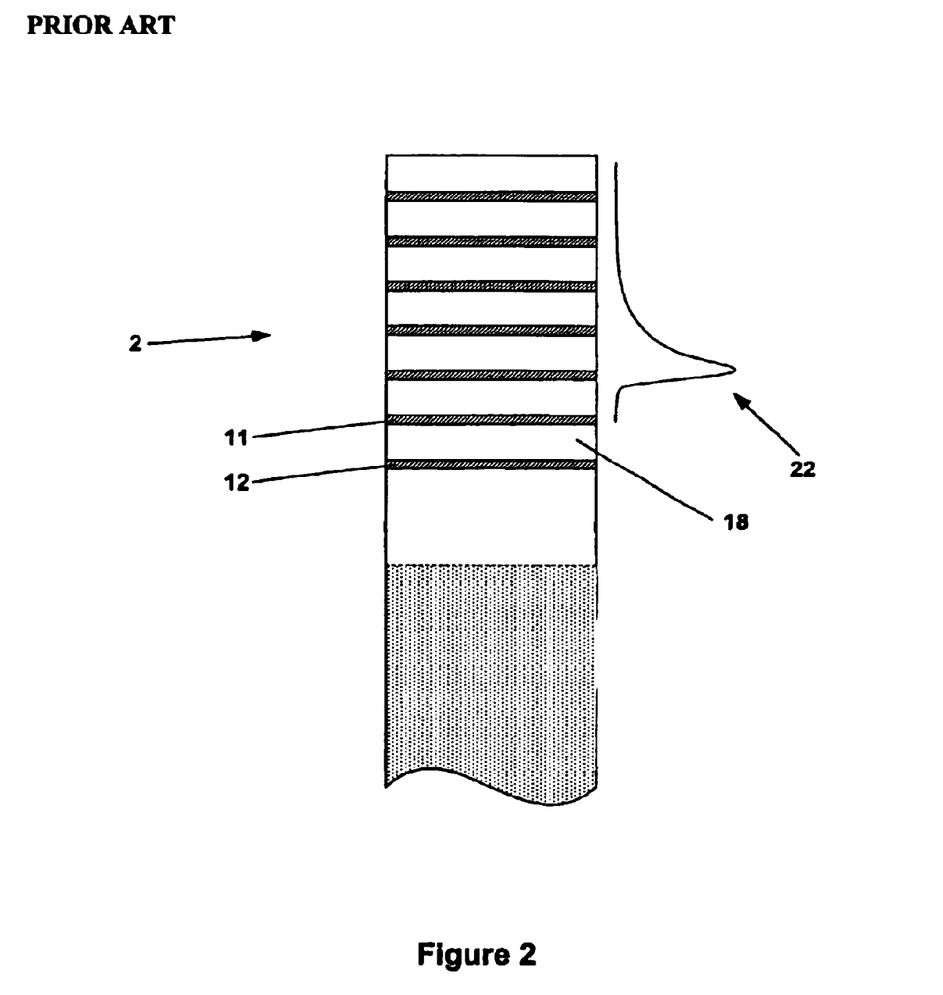
FIG. 2 is a schematic representation of the quantum well heterostructure and a defect depth profile produced by another prior art method.
Figure 3:
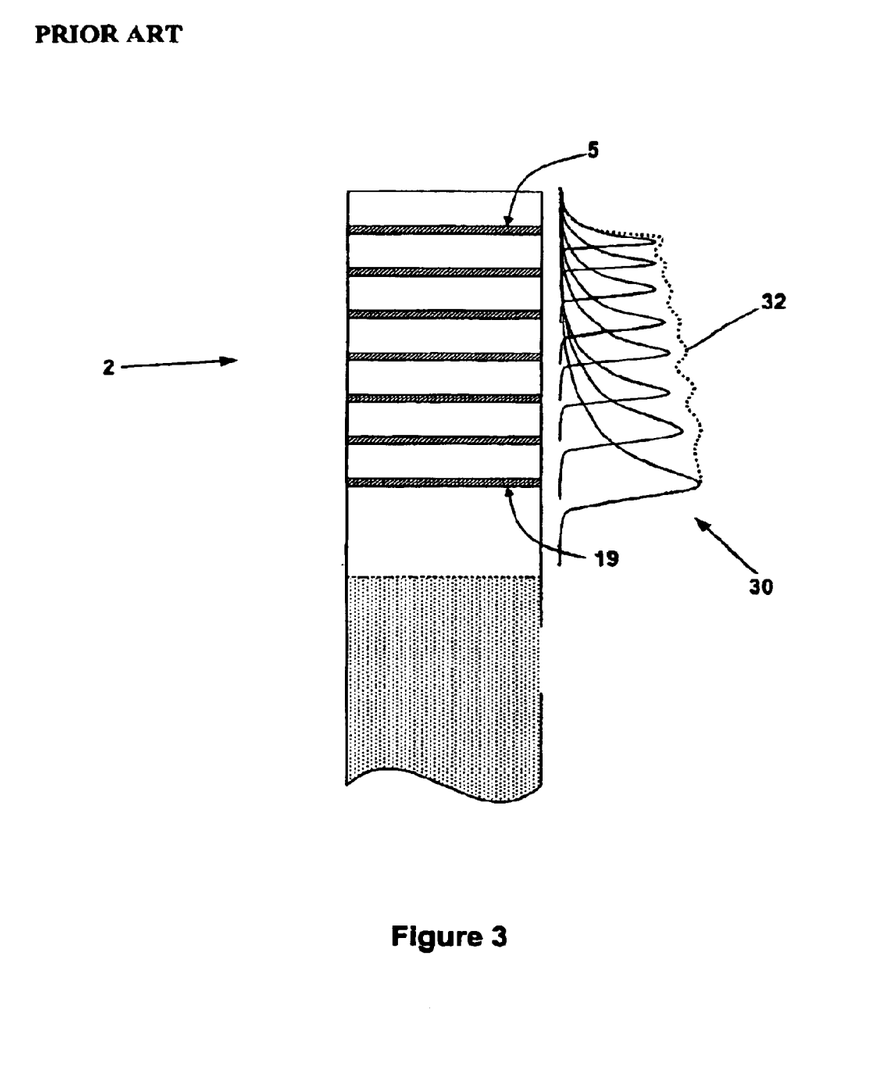
FIG. 3 is a schematic representation of the quantum well heterostructure and a defect depth profile produced by a further prior art method.

FIG. 2 shows a second approach used in the prior art, whereby a single implant is made directly into the heterostructure 2 to create a distribution of defects 22 within the heterostructure 2. This increases the efficiency of the process, since the defects 22 are created within the heterostructure 2. Hence all of the diffusing point defects are available for intermixing. However, because the defect depth distribution 22 varies considerably over the heterostructure 2, the degree of intermixing also varies considerably, with layers 11, 12, and 18 remaining largely unaffected by the implant. Hence the optical wavelength range of the heterostructure may be undesirably broadened. This disadvantage can be alleviated by performing multiple implants with different ion energies and fluences, calculated to give an approximately uniform distribution across the entire heterostructure 2. FIG. 3 shows a number of defect distributions 30 directed into the heterostructure 2, with a cumulative defect distribution 32 which is nearly constant within the heterostructure boundaries 5 and 19. In such a case, the heterostructure 2 may be annealed after each implantation step, or after all of the implantation steps have been completed. This multiple implant technique gives generally satisfactory results, but requires mathematical simulation of the net defect distribution 32, and is time consuming and expensive due to the multiple implant (and possibly anneal) steps.

It is desired, therefore, to provide one or more of an improved method for disordering a quantum well heterostructure, a quantum well heterostructure disordered by an improved method, an optoelectronic device including such a heterostructure, and an improved method for tuning the wavelength range of an optoelectronic device, or at least useful alternatives.

SUMMARY OF CERTAIN INVENTIVE ASPECTS

In accordance with a first aspect of the present invention there is provided a method of disordering a quantum well heterostructure, including the step of irradiating the heterostructure with a particle beam, where the energy of the beam is selected to create a substantially constant distribution of defects within the heterostructure. The selection of an appropriate beam energy for the particular heterostructure and irradiating particles results in the creation of a uniform defect distribution within the heterostructure using a single irradiation step, thus ensuring that the quantum wells of the heterostructure are disordered to a similar extent.

Preferably, the energy is such that the stopping power of the irradiating particles is predominantly due to electronic stopping processes within the heterostructure. The relatively low probability of nuclear stopping processes decreases the probability of creating dense collision cascades, and promotes a more uniform distribution of point defects.

Preferably, the energy is sufficient for a substantial proportion of the particles to pass through the heterostructure. Because the stopping power of a particle varies most strongly as it comes to rest, a more constant defect distribution within the heterostructure can be obtained by ensuring that the majority of particles pass through the heterostructure and that the projected range of the particle lies well beyond it.

Preferably, the variation of defect distribution with depth within the heterostructure is less than 50%. More preferably, the variation is of the order of 10% or less. This reduces the variation of wavelength shift with depth, and therefore produces a narrower range of response wavelengths.

In one form of the invention, the particles are electrons. Due to their low mass and charge, electrons produce simple point defects and are relatively inefficient at producing undesirable stable defect clusters by comparison with ions.

In another form of the invention, the particles are ions. Ions typically produce large numbers of defects, but many of these may be large defect clusters created by collision cascades. Preferably, the ions are characterised by an atomic number which is less than or equal to the highest atomic number of the heterostructure constituents. In general, ions of lower mass and charge will be more efficient at producing point defects relative to complex defects. Preferably, the ions are helium ions, or more preferably hydrogen ions. The latter are commonly available and easily produced in many types of particle accelerator.

Multiple irradiation steps can optionally be performed in accordance with the invention, with an annealing step following each irradiation step. Preferably, the annealing step following each irradiation step is sufficient to substantially eliminate extended defects resulting from the irradiation step. This allows large wavelength shifts to be obtained without forming extended defects which may be detrimental to devices.

In accordance with a second aspect of the present invention, there is provided a method of tuning the wavelength range of an optoelectronic device, including the step of disordering a quantum well heterostructure of the device by irradiating the heterostructure with a particle beam, wherein the energy of the beam is selected to create a substantially constant distribution of defects within the heterostructure.

In accordance with a third aspect of the present invention, there is provided a quantum well heterostructure which has been disordered by a method which includes the step of irradiating the heterostructure with a particle beam, where the energy of the beam is selected to create a substantially constant distribution of defects within the heterostructure.

The present invention also provides an optoelectronic device, including a quantum well heterostructure disordered by irradiating the heterostructure with a proton beam, wherein the energy of the beam is selected so that a substantial proportion of the beam passes through the heterostructure and creates a substantially constant distribution of defects within the heterostructure.

BRIEF DESCRIPTION OF THE DRAWINGS

Preferred embodiments of the present invention are hereinafter described, by way of example only, with reference to the accompanying drawings, wherein.

DETAILED DESCRIPTION OF CERTAIN INVENTIVE EMBODIMENTS

Figure 4:
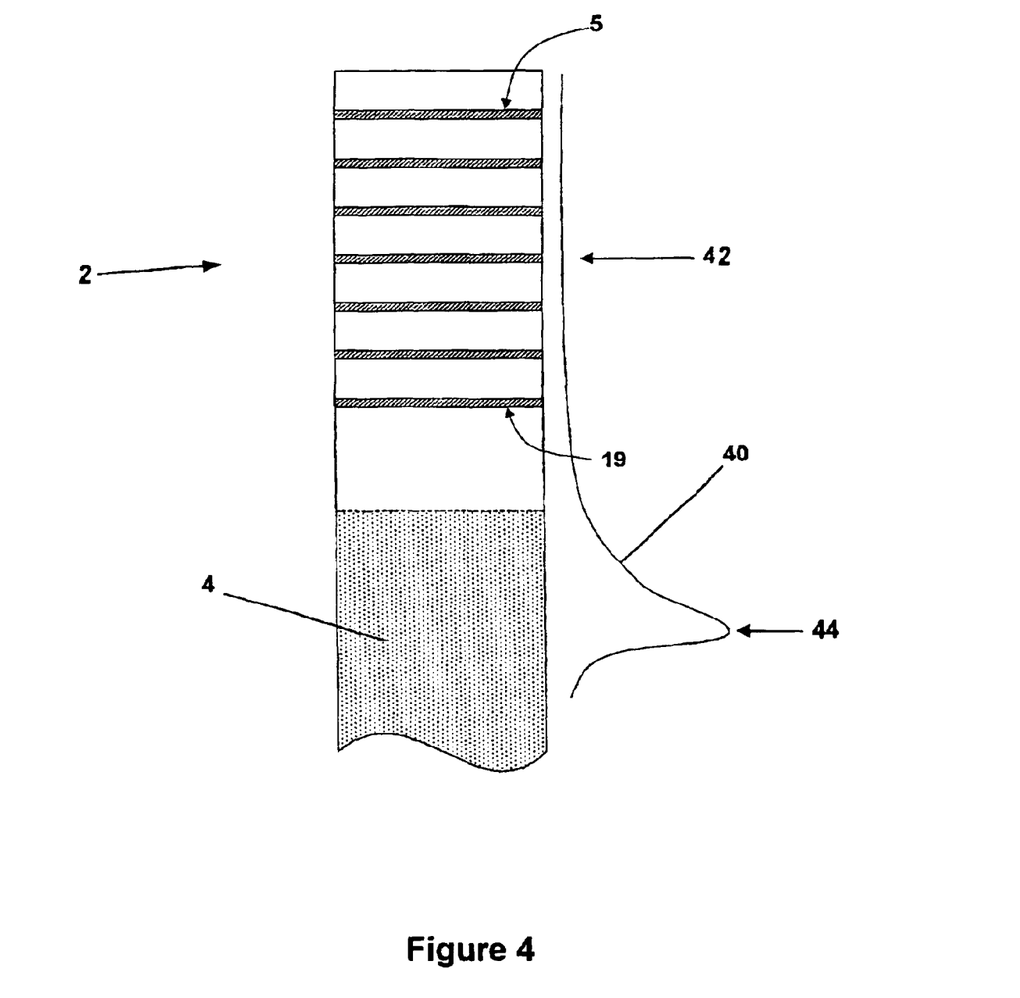
FIG. 4 is a schematic representation of the quantum well heterostructure and a defect depth profile produced by a preferred embodiment of the present invention.

FIG. 4 shows a quantum well heterostructure 2 containing layers 6 to 12 of a first semiconductor and layers 13 to 18 of a second semiconductor, as described above. Those skilled in the art will appreciate that details of the buffer, capping and contact layers have been omitted from the figures and text to simplify the discussion. FIG. 4 also shows a defect depth profile produced according to a preferred embodiment of the present invention, wherein the defect distribution 40 extends well beyond the deepest interface 16 of the heterostructure 2. In this embodiment, the ion energy is sufficient for ions to pass through the heterostructure 2. It will be apparent that the disadvantages of the prior art are alleviated by irradiating the heterostructure with ions of sufficient energy to create a substantially constant distribution of defects within the heterostructure 2. Specifically, the advantage of this method is that the portion 42 of the defect distribution 40 produced within the heterostructure 2, that is, between the top interface 5 and the bottom interface 19, is essentially constant. This is because the energy of the ions passing through the heterostructure 2 is sufficiently high that the probability of inelastic collisions between the high energy ions and the atoms of the heterostructure 2 does not vary significantly throughout the heterostructure 2. After passing through the heterostructure 2, the ions eventually lose enough energy through atomic collisions that the probability for nuclear scattering increases sharply with decreasing energy until the ion energy is insufficient to create further defects. Thus the defect distribution 40 has a relatively constant portion 42 at shallow depths and a pronounced peak 44 at greater depths, near the projected ion range. In FIG. 4, the peak 44 of maximum defect density lies within the substrate 4 below the heterostructure 2, which may be desirable in cases where either the implanted species or defects formed near the projected ion range could be detrimental to the heterostructure 2, and the substrate 4 acts as an isolation barrier.

If the substrate 4 below the heterostructure is sufficiently thin (for example, if the substrate wafer 4 has been etched from the backside), the irradiating ions can pass right through the entire wafer. This can be advantageous if the irradiating ion species is detrimental to the heterostructure 2 or other components of the implanted wafer because it ensures that the majority of the irradiating particles do not come to rest in the irradiated wafer and therefore cannot diffuse into the heterostructure 2 during subsequent thermal processing. It also prevents the formation of stable and optically or electrically active defects that might otherwise form near the projected ion range. For a given heterostructure, the energy required to achieve this depends upon the ion species; lower atomic number species are preferred because lower energies are required and they generally produce a more uniform distribution of simple defects than high atomic number species.

In an alternative embodiment, electrons are used as the irradiating particle. Due to their low mass and charge, electron beams typically create uniform distributions of point defects. Relative to ion irradiation, electron irradiation creates few complex defects, which are undesirable because they do not contribute directly to quantum well disordering and may trap diffusing point defects, preventing them from disordering the quantum well boundaries. However, the hydrogen ion or proton is preferred as the irradiating particle because it is a commonly available and easily produced ion species in many particle accelerators, and produces large wavelengths shifts and high photoluminescence intensities in GaAs/AlGaAs, InGaAs/(Al)GaAs, and InP/InGaAsP systems.

If a large degree of disordering is required, e.g., to obtain a large wavelength shift of the heterostructure 2, stable defect formation can be inhibited by performing multiple irradiation steps with an annealing step following each irradiation. The annealing steps are preferably sufficient to eliminate extended defects resulting from the previous irradiation steps.

EXAMPLE

An application of a preferred embodiment of the above method to quantum well infrared photodetectors (QWIPs) will be described. The QWIPs were n-type bound-to-continuum devices grown by molecular beam epitaxy on (100) semi-insulating GaAs substrates. Each QWIP contained 50 quantum wells between a 2 $\mu$m top and 1.3 $\mu$m bottom n$^+$ GaAs contact layers grown on 0.51 $\mu$m AlAs buffers layers. Each well was nominally 4.5 nm, $10^{18}$ cm$^{-3}$ Si doped GaAs, between 50 nm undoped $Al_{0.3}Ga_{0.7}As$ barrier layers. The devices were implanted with 0.9 MeV protons at room temperature in order to locate the peak of the displacement profile within the substrate and to produce a nearly constant distribution of defects within the quantum well region.

Figure 5:
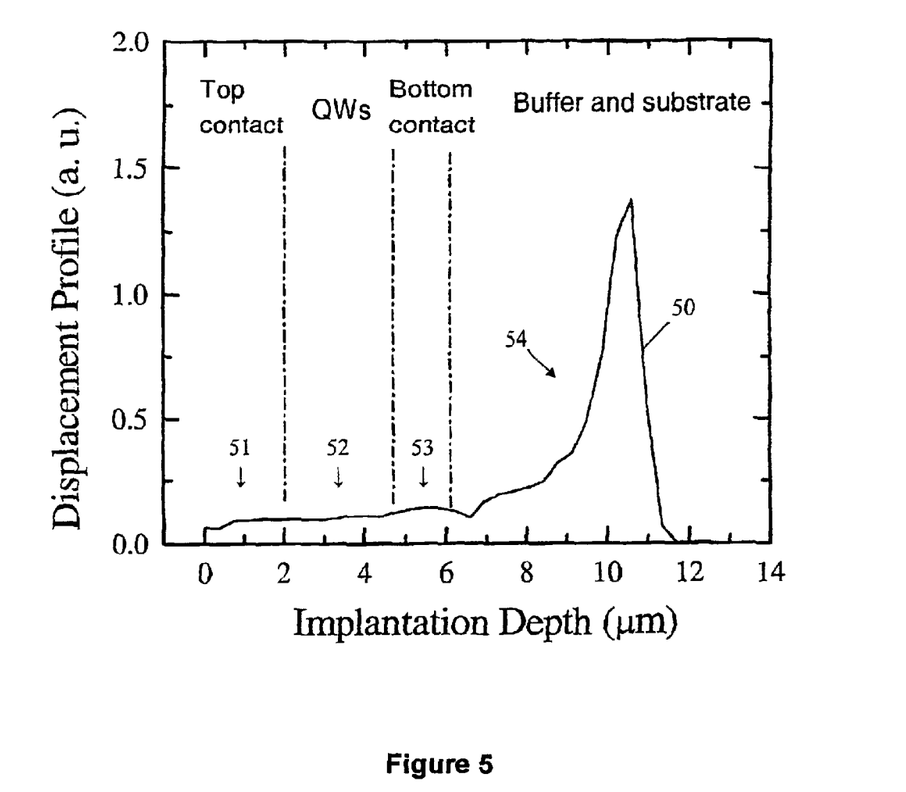
FIG. 5 is a graph of the calculated displacement profile as a function of depth in a quantum well infrared photodetector which has been processed in accordance with a preferred embodiment of the present invention.
Figure 6:
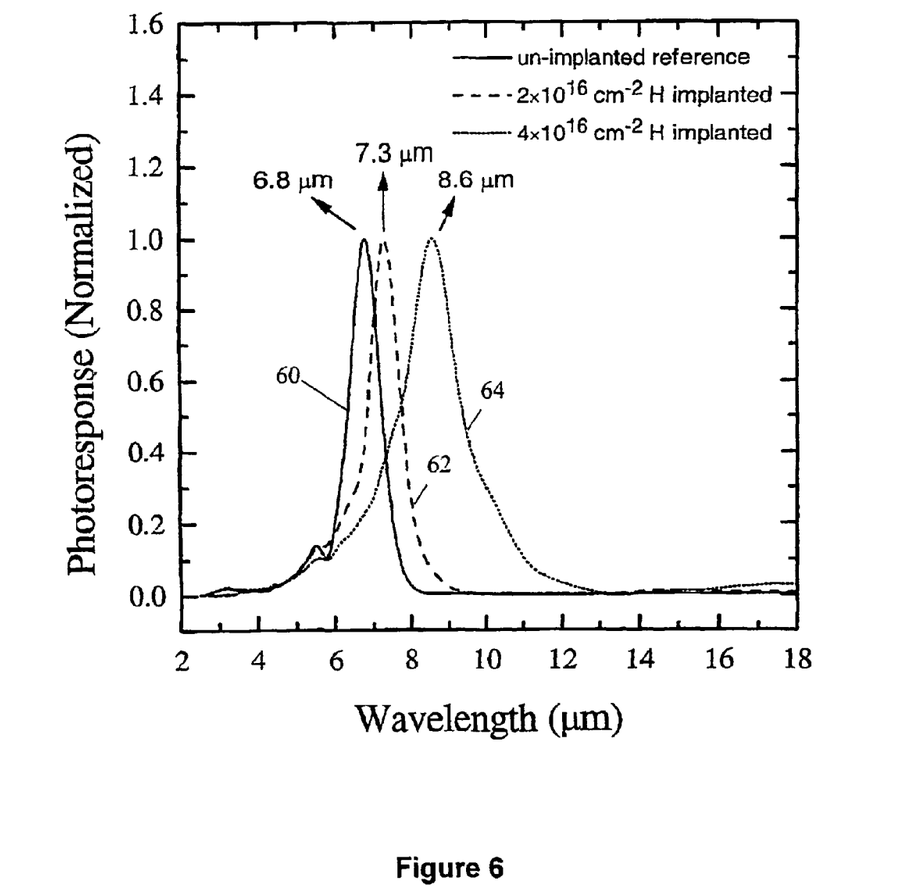
FIG. 6 is a graph of the photo-response as a function of wavelength from a quantum well infrared photodetector which has been processed in accordance with a preferred embodiment of the present invention.

As illustrated in FIG. 5, the displacement profile 50 calculated by Monte-Carlo simulation as a function of depth in a QWIP heterostructure may be divided into a number of segments corresponding to various parts of the QWIP. The number of displacements produced in the contact regions 51, 53 and the quantum wells 52 vary by only a few percent, whereas the number of displacements produced in the substrate region 54 varies considerably (by more than a factor of five in this case). The QWIPs were implanted to fluences of $2 \times 10^{16}$ cm$^{-2}$ or $4 \times 10^{16}$ cm$^{-2}$. After implantation, they were annealed under flowing Ar at 950° C. for 30 seconds. Ohmic contacts to the QWIPs were formed by evaporation of Au—Ni—Ge, and a 6 $\mu$m-period grating was etched to allow normal incidence operation. The QWIPs were mounted in a liquid nitrogen cooled dewar for photocurrent and current-voltage (I-V) measurements. The absolute responsivity was measured using a 500 K calibrated blackbody as an infrared source at room temperature. FIG. 6 shows typical infrared spectral responses from the QWIPs, acquired with a Fourier transform spectrometer. The spectral responses are from an unimplanted reference QWIP (solid line 60), and from QWIPs implanted to fluences of $2 \times 10^{16}$ H cm$^{-2}$ (dashed line 62) and $4 \times 10^{16}$ H cm$^{-2}$ (dotted line 64). The corresponding peak spectral response of the QWIPs shifts from 6.8 $\mu$m to 7.3 $\mu$m and 8.6 $\mu$m due to the intermixing. The spectral linewidth ($\Delta\lambda/\lambda$) first narrows from 13.8% to 12.8%, and then broadens to 20.2%. The narrowing at the lowest ion fluence is believed to be due to the re-localisation of the quantum well excited state from a continuum state to an isolated bound state near the top of the well. The broadening of the spectral response at the higher fluence is due to reductions in quantum confinement and tunnelling time in response to the reduced quantum well barrier height. It was found that in order to avoid excessive broadening of the spectral response, the variation of defect density is preferably less than 50% within the heterostructure 2, and is more preferably of the order of 10% or less.

Many modifications will be apparent to those skilled in the art without departing from the scope of the present invention as hereinbefore described with reference to the accompanying drawings and/or example.

What is claimed is:

1. A method of disordering a quantum well heterostructure, comprising irradiating said heterostructure with a particle beam, wherein an energy of said particle beam is selected to create a substantially constant distribution of defects within said heterostructure.

2. A quantum well heterostructure disordered by a method of claim 1.

3. An optoelectronic device, including the quantum well heterostructure of claim 2.

4. A photodetector, including the quantum well heterostructure of claim 2.

5. A method as claimed in claim 1, wherein said energy is selected to allow a substantial proportion of said particles pass through said hetero structure.

6. A method as claimed in claim 1, wherein a variation of defects with depth within said heterostructure is less than 50%.

7. A method as claimed in claim 1, wherein a variation of defects with depth within said heterostructure is of the order of 10% or less.

8. A method as claimed in claim 1, wherein said particle beam is an electron beam.

9. A method as claimed in claim 1, wherein said particle beam is an ion beam.

10. A method as claimed in claim 1, wherein said particle beam is an ion beam characterised by an atomic number which is less than or equal to the highest atomic number of the constituents of said heterostructure.

11. A method as claimed in claim 1, wherein said particle beam is a beam of helium ions.

12. A method as claimed in claim 1, wherein said particle beam is a beam of hydrogen ions.

13. A method of disordering a quantum well heterostructure, comprising:
   (i) irradiating said heterostructure with a particle beam, wherein an energy of said particle beam is selected to create a substantially constant distribution of defects within said heterostructure,
   (ii) annealing said heterostructure, and
   (iii) repeating steps (i) and (ii).

14. A method as claimed in claim 13, wherein said annealing steps are sufficient to substantially eliminate extended defects resulting from said step of irradiating.

15. A method of tuning the wavelength range of an optoelectronic device, comprising disordering a quantum well heterostructure of said optoelectronic device by irradiating said heterostructure with a particle beam, wherein an energy of said particle beam is selected to create a substantially constant distribution of defects within said heterostructure.

16. A method as claimed in claim 15, wherein said energy is selected so that the irradiating particles having a stopping power that is predominantly due to electronic stopping processes within said heterostructure.

17. A method as claimed in claim 15, wherein said energy is selected to allow a substantial proportion of said beam particles to pass through said heterostructure.

18. A method as claimed in claim 15, wherein a variation of defect distribution with depth within said heterostructure is less than 50%.

19. A method as claimed in claim 18, wherein said variation is of the order of 10% or less.

20. A method as claimed in claim 15, wherein said particle beam is an electron beam.

21. A method as claimed in claim 15, wherein said particle beam is an ion beam.

22. A method as claimed in claim 21, wherein said ion beam is characterised by an atomic number which is less than or equal to the highest atomic number of the constituents of said heterostructure.

23. A method as claimed in claim 22, wherein said ion beam is a beam of helium ions.

24. A method as claimed in claim 22, wherein said ion beam is a beam of hydrogen ions.

25. An optoelectronic device, comprising a quantum well heterostructure disordered by irradiating said heterostructure with a proton beam, wherein the energy of said beam is selected so that a substantial proportion of said beam passes through said heterostructure and creates a substantially constant distribution of defects within said heterostructure.

* * * * *